United States Patent [19]

Tanimura

[11] 4,429,374
[45] Jan. 31, 1984

[54] MEMORY ARRAY ADDRESSING

[75] Inventor: Nobuyoshi Tanimura, Musashino, Japan

[73] Assignee: Hitachi, Ltd., Tokyo, Japan

[21] Appl. No.: 270,654

[22] Filed: Jun. 4, 1981

[30] Foreign Application Priority Data

Jun. 4, 1980 [JP] Japan .................. 55-74247

[51] Int. Cl.³ .............................. G11C 8/00
[52] U.S. Cl. ................... 365/230
[58] Field of Search .............. 365/230, 231

[56] References Cited

U.S. PATENT DOCUMENTS

| 4,094,012 | 6/1978 | Perlegos et al. | 365/230 |
| 4,103,349 | 7/1978 | Marmet | 365/230 |
| 4,104,735 | 8/1978 | Hofmann et al. | 365/231 |
| 4,194,130 | 3/1980 | Moench | 365/230 |
| 4,264,828 | 4/1981 | Perlegos et al. | 365/230 |
| 4,344,005 | 8/1982 | Stewart | 365/230 |

FOREIGN PATENT DOCUMENTS

| 24894 | 3/1981 | European Pat. Off. | 365/230 |
| 2001697 | 2/1977 | Fed. Rep. of Germany . | |
| 2935121 | 3/1980 | Fed. Rep. of Germany . | |
| 2946803 | 6/1980 | Fed. Rep. of Germany . | |
| 56-41578 | 4/1981 | Japan | 365/230 |
| 1272551 | 5/1972 | United Kingdom . | |
| 1380776 | 1/1975 | United Kingdom . | |
| 1469231 | 4/1977 | United Kingdom . | |
| 2060303 | 4/1981 | United Kingdom | 365/230 |

OTHER PUBLICATIONS

Firmenprospekt "Announcing, Mosteks," MK 4027 pp. 1-4.
Siemens–Forschung und Entwicklunk, Beright, NR. 4, 1975, pp. 197–202 "A 4096–Bit MOS Memory Device with Single–Transistor Cells" Heibing et al.

Primary Examiner—George G. Stellar
Attorney, Agent, or Firm—Antonelli, Terry & Wands

[57] ABSTRACT

The address decoder for one axis comprises NAND circuits while the address decoder for the other axis comprises NOR circuits. A semiconductor memory circuit device comprises at least first and second decoder circuits. The first decoder circuit is so constructed as to receive at least partial address signals among address signals of a plurality of bits and to provide decoded signals of the partial address signals as intermediate signals. The second decoder circuit is so constructed as to receive the intermediate signals, to thereby provide signals for selecting from among a plurality of memory circuits a memory circuit determined by the address signals of the plurality of bits. Thus, the semiconductor memory circuit device is allowed to operate at a high speed. A semiconductor substrate on which the semiconductor memory circuit device is formed can also be made comparatively small.

9 Claims, 19 Drawing Figures

MEMORY ARRAY ADDRESSING

BACKGROUND OF THE INVENTION

This invention relates to a semiconductor memory circuit device (hereinbelow, termed "memory"), and more particularly to a memory constructed of complementary insulated gate field effect transistors.

In the memory, one of a plurality of memory circuits (hereinbelow, termed "memory cells" or "cells") is selected on the basis of an output signal of an address decoder circuit.

Usually, the address decoder circuit includes switching elements (for example, insulated gate field effect transistors which shall hereinafter be termed "FETs") which are connected in series or in parallel and which are respectively turned "on" or "off" by address signals.

When the memory has come to have a large capacity as in recent years, address signals of an increased number of bits are required accordingly. In correspondence with the address signals, the number of the switching elements connected in series or in parallel within the address decoder circuit is increased.

In this regard, the switching elements cause stray capacitance to exist at various nodes of the circuit and have non-negligible operating resistances themselves. Therefore, the address decoder circuit including such an increased number of switching elements has its operating speed limited seriously.

The plurality of memory cells constructed as a semiconductor integrated circuit are usually arranged on a substrate such as a semiconductor substrate in the form of a matrix. Unit decoder circuits which constitute the address decoder circuit are arranged in correspondence with the memory cell rows or columns in the matrix arrangement.

In order to effectively utilize the surface of the semiconductor substrate, the unit decoder circuits need to be arranged at locations corresponding to the pitches of the memory cell rows or memory cell columns.

Nevertheless, it is difficult to arrange the unit decoder circuits including the increased number of switching elements at these pitches described above.

The increase in the number of switching elements also results in an increase in the area of element regions on the substrate.

The address decoder circuit can be constructed of complementary insulated gate field effect transistors (hereinbelow, termed "complementary FETs") in order to lower the power dissipation by reducing the operating current thereof.

However, the address decoder circuit to be constructed of complementary FETs requires a much larger number of switching elements in comparison with an address decoder circuit as is constructed of only FETs of the single channel type. It is, therefore, desirable that the operating speed, the pitch, the area, etc. as above stated be especially considered in the design of the address decoder circuit which is constructed of complementary FETs.

SUMMARY OF THE INVENTION

It is accordingly an object of this invention to provide a memory having an enhanced operating speed.

Another object of this invention is to provide a memory having a reduced substrate area.

Another object of this invention is to provide a memory which can effectively utilize the surface of a substrate.

Another object of this invention is to provide a memory, the implementation of which is suited to the use of complementary FETs.

Another object of this invention is to provide a memory having a simple design.

Further objects of this invention will become apparent from the following description taken in conjunction with the drawings.

To achieve these and other objects, the present invention provides a semiconductor memory device including means for receiving input address signals, each of which comprises a predetermined number of bits. This receiving means provides an output of at least first partial address signals each of which comprises a portion of said predetermined number of bits of a corresponding input address signal. A first decoder circuit receives said first partial address signals from said receiving means and provides intermediate decoded signals of said first partial address signals. A second decoder circuit, in turn, receives the intermediate decoded signals provided from said first decoder circuit, and provides output decoded signals for selecting a memory circuit determined by the input address signals from among a plurality of memory circuits.

DESCRIPTION OF THE PREFERRED EMBODIMENTS

Figure 1:
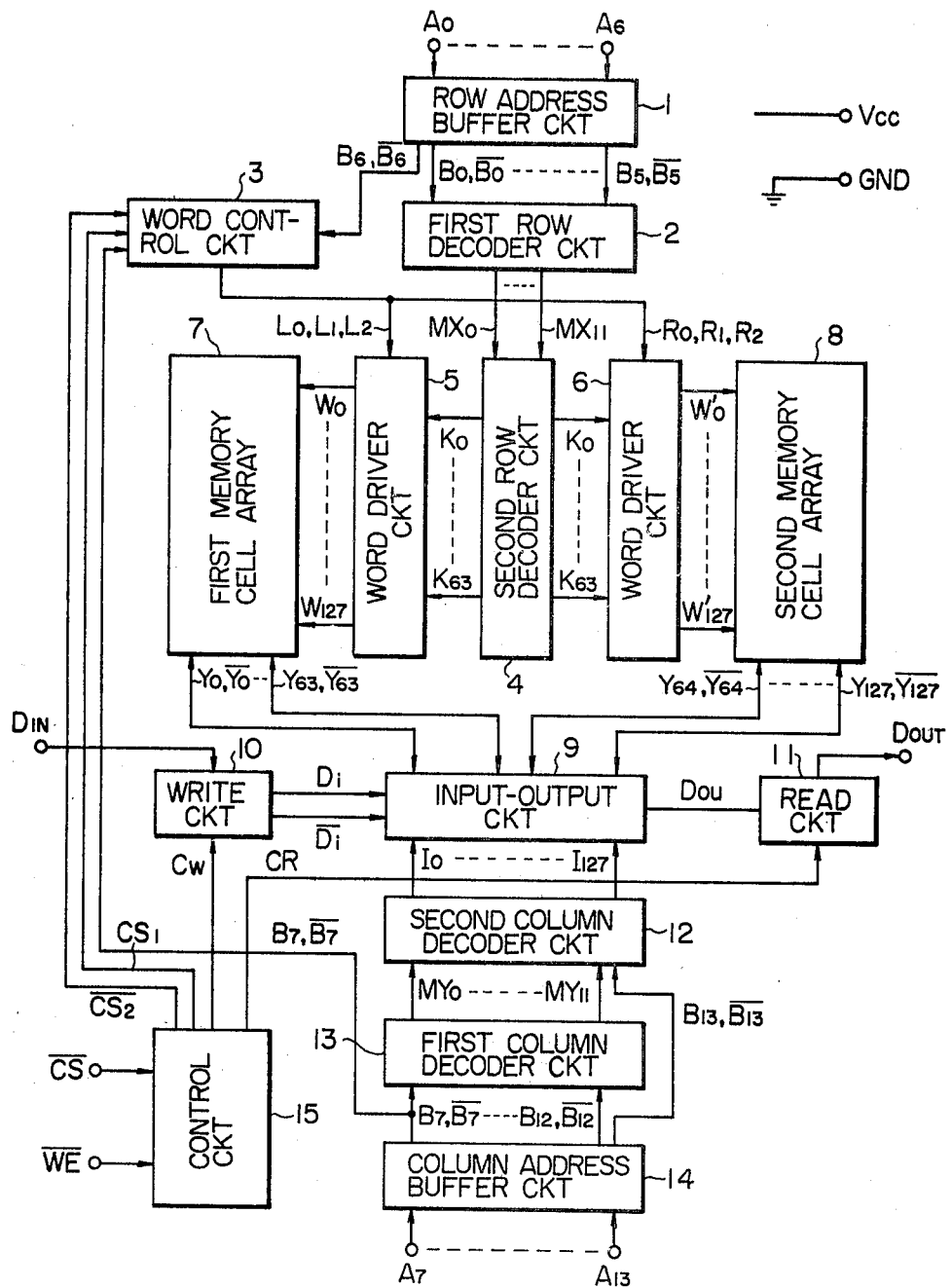
FIG. 1 is a block diagram of a memory which is an embodiment of this invention.

FIG. 1 is a circuit block diagram of a memory according to an embodiment of the present invention.

Referring to the figure, numerals 1 and 14 designate row and column address buffer circuits respectively, numerals 2 and 13 first row and column decoder circuits respectively, numerals 4 and 12 second row and column decoder circuits respectively, numerals 5 and 6 word driver circuits, numerals 7 and 8 first and second memory cell arrays respectively, and numeral 3 a word control circuit. The respective circuit blocks mentioned above will be described in detail later with reference to FIGS. 2 to 6. In FIG. 1, numeral 10 indicates a write circuit, numeral 11 a read circut, and numeral 15 a control circuit.

The control circuit 15 receives a chip select signal and a write control signal at a chip select terminal $\overline{CS}$ and a write control terminal $\overline{WE}$ respectively, and thereby provides terminals $CS_1$ and $\overline{CS_2}$, $C_W$ and $C_R$ with control signals for controlling the operations of the word control circuit 3, the write circuit 10 and the read circuit 11 respectively.

According to a preferred embodiment of the present invention, in order to establish a memory capacity of 16 kilobits, each of the memory cell arrays 7 and 8 is constructed of static memory cells in the number of 8,192, in other words, of 8,192 bits arranged into a matrix of 128 rows and 64 columns. However, the invention is not restricted to this particular memory capacity.

Figure 2:
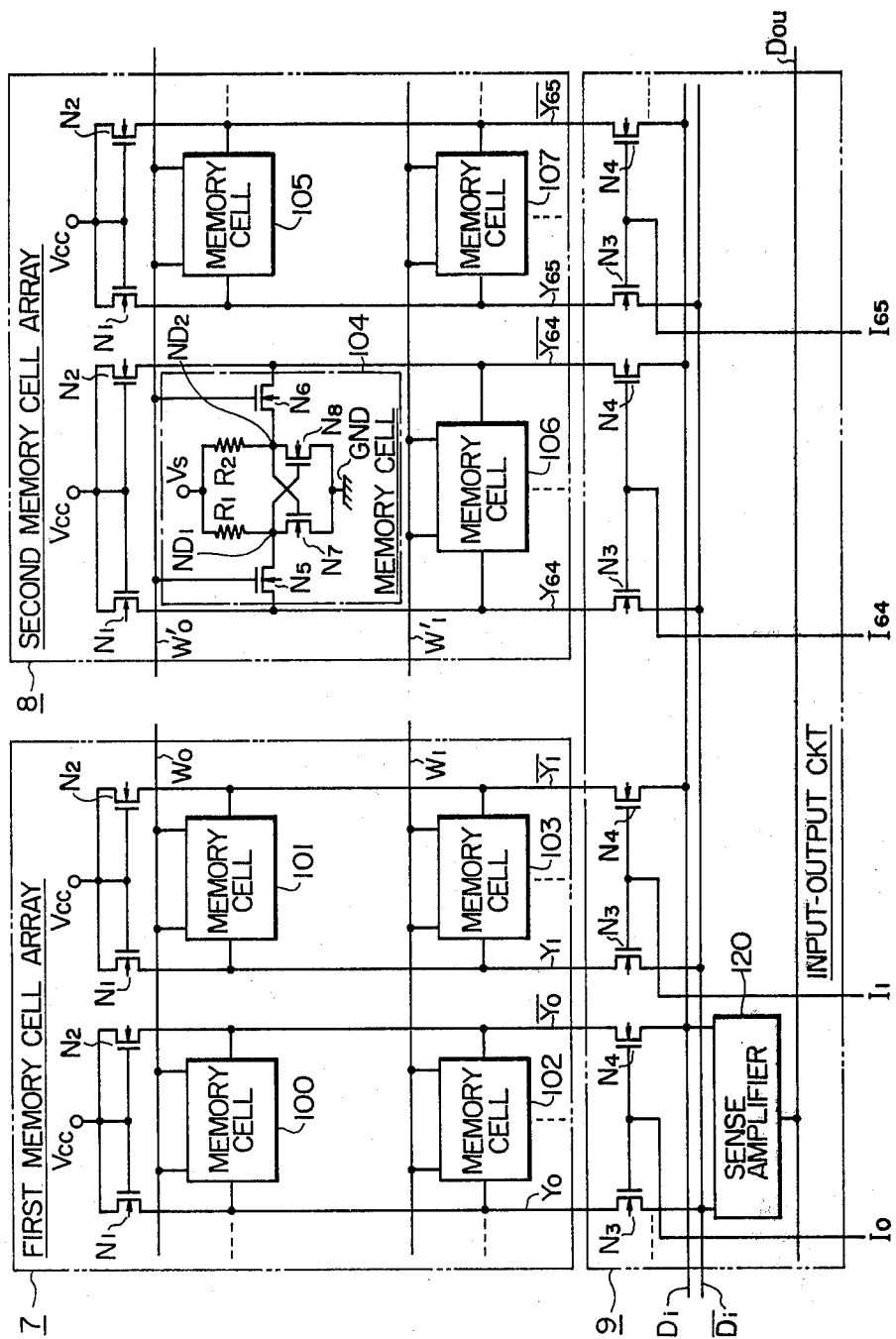
FIG. 2 is a circuit diagram of memory cell arrays and input/output circuits.

Each memory cell is constructed so as to have select terminals and data input/output terminals as shown in FIG. 2. The respective select terminals of a plurality of memory cells arranged in an identical column are connected in common to one word line, while the respective data input/output terminals of a plurality of memory cells arranged in an identical column are connected in common to data lines as shown in FIG. 2. In the preferred embodiment with a 16 kilobit capacity, as mentioned above, each of the memory cell arrays 7 and 8 has 128 word lines and 64 pairs of data lines.

The word lines $W_0$ to $W_{127}$ of the memory cell array 7 are selected by the word drive circuit 5, while the word lines $W_0'$ to $W_{127}'$ of the memory cell array 8 are selected by the word drive circuit 6 as shown in FIG. 1.

The data line pairs $Y_0$, $\overline{Y_0}$ to $Y_{63}$, $\overline{Y_{63}}$ and $Y_{64}$, $\overline{Y_{64}}$ to $Y_{127}$, $\overline{Y_{127}}$ of the respective memory cell arrays 7 and 8 are selected by an input/output circuit 9.

Address signals for selecting the word lines $W_0$ to $W_{127}$ and $W_0'$ to $W_{127}'$ are supplied to terminals $A_0$ to $A_6$, while address signals for selecting the data line pairs $Y_0$, $\overline{Y_0}$ to $\overline{Y_{127}}$, $Y_{127}$ are supplied to terminals $A_7$ to $A_{13}$.

The row address buffer circuit 1 receives address signals of 7 bits supplied to the terminals $A_0$ to $A_6$ (hereinbelow, written in the manner of address signals $A_0$ to $A_6$), and thereby provides non-inverted address signals $B_0$ to $B_6$ and inverted address signals $\overline{B_0}$ to $\overline{B_6}$.

In the embodiment shown, among the 7-bit address signals provided from the address buffer circuit 1, the address signals of 6 bits, or $B_0$, $\overline{B_0}$ to $\overline{B_5}$, $B_5$ are supplied to the first decoder circuit 2, and the address signal of the remaining 1 bit, or $B_6$, $\overline{B_6}$ is supplied to the word control circuit 3. However, the invention could also be practiced with different numbers of bits being respectively applied to the first decoder and the word control circuit.

The first decoder circuit 2 receives the address signals $B_0$, $\overline{B_0}$ to $B_5$, $\overline{B_5}$ and thereby provides decoded signals $MX_0$ to $MX_{11}$. The decoded signals $MX_0$ to $MX_{11}$ are signals which are respectively obtained by the combinations of specified ones among the 6-bit address signals $B_0$, $\overline{B_0}$ to $B_5$, $\overline{B_5}$. For example, the address signals $B_0$, $\overline{B_0}$ to $B_5$, $\overline{B_5}$ are divided by means of the first decoder circuit 2 into three groups each consisting of 2 bits, and they are decoded in a group unit.

In the embodiment shown, the decoded signals $MX_0$ to $MX_{11}$ are called "intermediate signals" because they are signals obtained at an intermediate stage in the course of finally obtaining decoded signals which are in one-to-one correspondence with the states of the address signals $B_0$, $\overline{B_0}$ to $B_5$, $\overline{B_5}$.

The second decoder circuit 4 receives the intermediate signals delivered from the first decoder circuit 2, and thereby provides decoded signals $K_0$ to $K_{63}$. The respective decoded signals $K_0$ to $K_{63}$ are in one-to-one correspondence with the states of the 6 bits of the address signals $B_0$, $\overline{B_0}$ to $B_5$, $\overline{B_5}$.

Since each of the intermediate signals $MX_0$ to $MX_{11}$ is formed by the logical operation of the 2-bit address signals as described above, each of the decoded signals $K_0$ to $K_{63}$ can be formed by decoding 3 bits among the 12-bit intermediate signals.

The decoded signals $K_0$ to $K_{63}$ delivered from the second decoder circuit 4 are supplied to the word drive circuits 5 and 6. Each of the word drive circuits 5 and 6, in turn, has its operation controlled by the word control circuit 3. The word control circuit 3 receives the address signals $B_6$ and $\overline{B_6}$ delivered from the address buffer circuit 1, the control signals $CS_1$ and $\overline{CS_2}$ delivered from the control circuit 15, and address signals $B_7$ and $\overline{B_7}$ delivered from the address buffer circuit 14, and thereby provides control signals $L_0$, $L_1$ and $L_2$ to be supplied to the word drive circuit 5, and control signals $R_0$, $R_1$ and $R_2$ to be supplied to the word drive circuit 6.

The word drive circuit 5 is constructed so as to provide word signals for selecting the 128 word lines of the memory cell array 7 on the basis of the 64-bit decoded signals provided from the second decoder circuit 4 and the control signals provided from the word control circuit 3.

Similarly, the word drive circuit 6 is constructed so as to deliver 128 word signals to the word lines $W_0'$ to $W_{127}'$ under the control of the control signals $R_0$, $R_1$ and $R_2$.

Where a single decoder circuit is used in lieu of the aforecited first and second decoder circuits, each of unit decoder circuits which constitute the single decoder circuit must decode the 6-bit address signals $B_0$, $\overline{B_0}$ to $B_5$, $\overline{B_5}$.

In contrast, in using the construction as shown in FIG. 1, each of unit decoder circuits which constitute the first decoder circuit 2 may decode only 2-bit address signals, and each of unit decoder circuits which constitute the second decoder circuit 4 may decode only the 3-bit intermediate signals as explained above.

Thus, the number of switching elements to be incorporated in a section extending from the address signals input terminals to the input end of the word drive circuit can be reduced.

In addition, the number of switching elements constituting the first and second decoder circuits can be reduced.

Where the address signals are substantially decoded by the word drive circuits 5 and 6 as in FIG. 2, the number of the unit decoder circuits to constitute the second decoder circuit 4 can be made smaller with respect to the number of the word lines of the memory cell arrays 7 and 8.

The column address buffer circuit 14 is constructed similarly to the row address buffer circuit 1, and responds to the input address signals $A_7$ to $A_{13}$ to provide non-inverted address signals $B_7$ to $B_{13}$ and inverted address signals $\overline{B_7}$ to $\overline{B_{13}}$.

The first decoder circuit 13 receives the address signals of 6 bits, or $B_7$ to $B_{12}$ and $\overline{B_7}$ to $\overline{B_{12}}$ among the address signals of 7 bits, and provides intermediate signals $MY_0$ to $MY_{11}$ on the basis of these address signals.

The second decoder circuit 12 receives the intermediate signals $MY_0$ to $MY_{11}$ and the address signals $B_{13}$ and $\overline{B_{13}}$, and provides signals $I_0$ to $I_{127}$. The decoded signals $I_0$ to $I_{127}$ have one, corresponding to the address signals $B_7$ to $B_{13}$ and $\overline{B_7}$ to $\overline{B_{13}}$, of a high level by way of example and the others of a low level.

The input/output circuit 9 includes a pair of common data lines, and column select circuits (not shown) which are connected between the common data lines and the data lines of the memory cell arrays 7 and 8 and which are respectively turned "on" or "off" by the output signals $I_0$ to $I_{127}$ of the second decoder circuit 12. If necessary, the input/output circuit 9 further includes a sense amplifier (not shown) which receives signals from the common data lines.

The write circuit 10 has a non-inverting output terminal $D_i$ and an inverting output terminal $\overline{D_i}$ which are coupled to the common data lines of the input/output circuit 9.

The write circuit 10 has its operation controlled by the control signal $C_W$. When the control signal $C_W$ is at a writing operation level, the write circuit 10 provides the output terminals $D_i$ and $\overline{D_i}$ with a non-inverted signal and an inverted signal corresponding to a signal applied to an input terminal $D_{in}$, respectively. When the control signal $C_W$ is at a non-writing operation level, the output terminals $D_i$ and $\overline{D_i}$ are brought into floating states.

The read circuit 11 has its operation controlled by the control signal $C_R$. When the control signal $C_R$ is at a reading operation level, the read circuit 11 provides a signal corresponding to an output signal from the input/output circuit 9. When the control signal $C_R$ is at a non-reading operation level, an output terminal of the read circuit 11 is brought into a floating state.

In the memory of FIG. 1, the word lines of the memory cell arrays 7 and 8 are selected by the word drive circuits 5 and 6, and the data lines thereof are selected by the input/output circuit 9.

Accordingly, only one memory cell in the memory cell array 7 or 8 as selected through the word line and the data line is coupled to the common data line within the input/output circuit 9.

In reading out information, the signal level of the common data line as determined by the stored information of the selected memory cell is amplified by the sense amplifier within the input/output circuit 9, and an output signal from the sense amplifier is read out by the read circuit 11.

In writing in information, the signal level of the common data line within the input/output circuit 9 is determined by the write circuit 10, and the signal of the common data line is supplied to the memory cell through the selected data line. As a result, a signal provided from the write circuit 10 is written into the selected memory cell.

The various circuit blocks mentioned above are formed on a single semiconductor substrate by known semiconductor integrated circuit techniques. In that case, the terminals $A_0$ to $A_{13}$, $D_{in}$, $D_{out}$, $\overline{CS}$ and $\overline{WE}$ and power supply terminals $V_{CC}$ and GND are formed as external terminals of a semiconductor integrated circuit device (IC).

Now, examples of concrete circuits in the respective circuit blocks of FIG. 1 will be described.

This invention is especially suited to a memory constructed of complementary FETs although it is not necessarily restricted thereto. Accordingly, the circuits to be described below are chiefly constructed of complementary FETs.

FIG. 2 shows concrete circuits of parts of the memory cell arrays 7 and 8 and the input/output circuit 9.

The memory cell arrays 7 and 8 include memory cells in the matrix arrangement 100 to 103, and 104 to 107; word lines $W_0$ and $W_1$, and $W_0'$ and $W_1'$; pairs of data lines $Y_0$, $\overline{Y_0}$ and $Y_1$, $\overline{Y_1}$, and $Y_{64}$, $\overline{Y_{64}}$ and $Y_{65}$, $\overline{Y_{65}}$; and FETs $N_1$ and $N_2$ for data line loads; respectively.

All the memory cells have the same construction. As typically illustrated in detail by the memory cell 104, each memory cell is constructed of N-channel type FETs $N_7$ and $N_8$, load resistances $R_1$ and $R_2$ as formed of high-resistivity polycrystalline silicon layers, the FETs and the resistances constituting a flip-flop circuit, and N-channel type FETs $N_5$ and $N_6$ for transfer.

The memory cell of the construction employing the load resistances made of the high-resistivity polycrystalline silicon layers can be formed into a relatively small size on the semiconductor substrate in comparison with the memory cell as constructed of the complementary FETs. Each memory cell can be rendered sufficiently low in power dissipation by using load resistances of high resistance value. In the preferred embodiment, accordingly, the memory cells are constructed of the single channel type FETs as explained above in spite of the fact that the other circuits to be described later are constructed of complementary FETs, though this is not especially restrictive.

The gates of the transfer FETs $N_5$ and $N_6$ form the select terminals of the memory cell. The output electrode of each of the transfer FETs $N_5$ and $N_6$ forms the input or output terminal of the memory cell.

As shown in the figure, in the memory cell arrays 7 and 8, the select terminals of the memory cells arranged in an identical rows are connected in common to one word line, and the respective pairs of input/output terminals of the memory cells arranged in an identical column are connected to one pair of data lines.

Each data line is connected to the source of the N-channel type FET for the load $N_1$ to $N_2$ the gate and drain of which are connected to the power supply terminal $V_{CC}$.

The input/output circuit 9 includes N-channel type FETs $N_3$ and $N_4$ which constitute the column select circuits, the common data lines $D_i$ and $\overline{D_i}$, the sense amplifier 120 and the output line $D_{OU}$.

The respective data line pairs of the memory cell arrays 7 and 8 are coupled to the common data lines $D_i$ and $\overline{D_i}$ through the corresponding FETs $N_3$ and $N_4$.

The gates connected in common, of the FETs $N_3$ and $N_4$ corresponding to each data line pair, are coupled to the corresponding output terminal of the second decoder circuit 12 (refer to FIG. 1).

The common data lines $D_i$ and $\overline{D_i}$ are connected to a pair of input terminals of sense amplifier 120 and the pair of output terminals of the write circuit 10 (refer to FIG. 1). The output terminal of the sense amplifier 120 is connected to the output line $D_{OU}$.

In the memory cell arrays 7 and 8, each word line is selected by the high level of the signal because the transfer FETs in the memory cell are of the N-channel type. Each data line pair is selected by the high level of the signal delivered from the second decoder circuit 12.

Figure 3A:
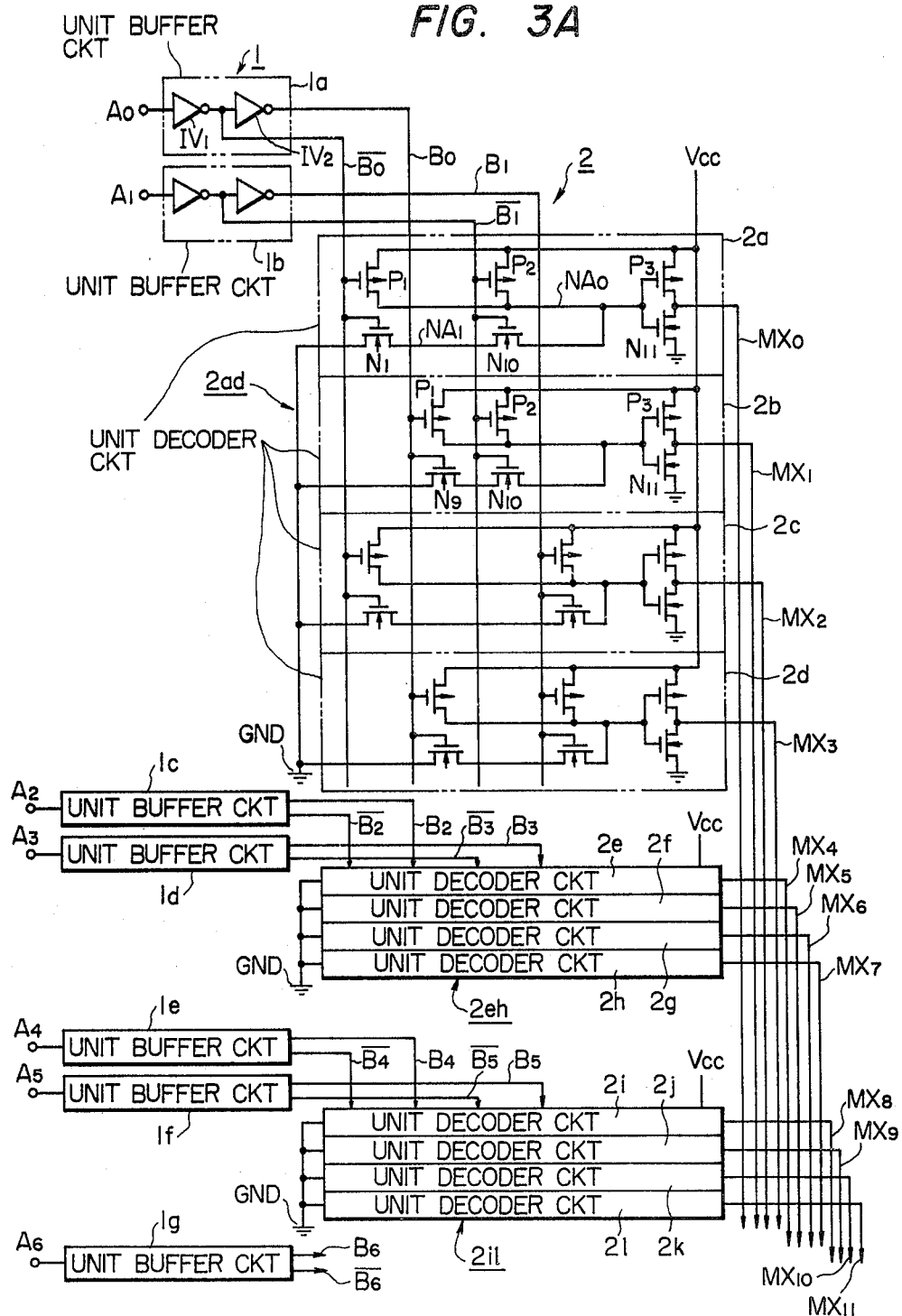
FIG. 3A is a circuit diagram of a row address buffer circuit and a first row decoder circuit.

FIG. 3A is a circuit diagram of the address buffer circuit 1 and the first address decoder circuit 2.

The address buffer circuit 2 is constructed of unit buffer circuits 1a to 1g which correspond to the terminals $A_0$ to $A_6$ respectively. Each unit buffer circuit is constructed of two inverter circuits $IV_1$ and $IV_2$ which are connected in cascade.

Figure 3B:
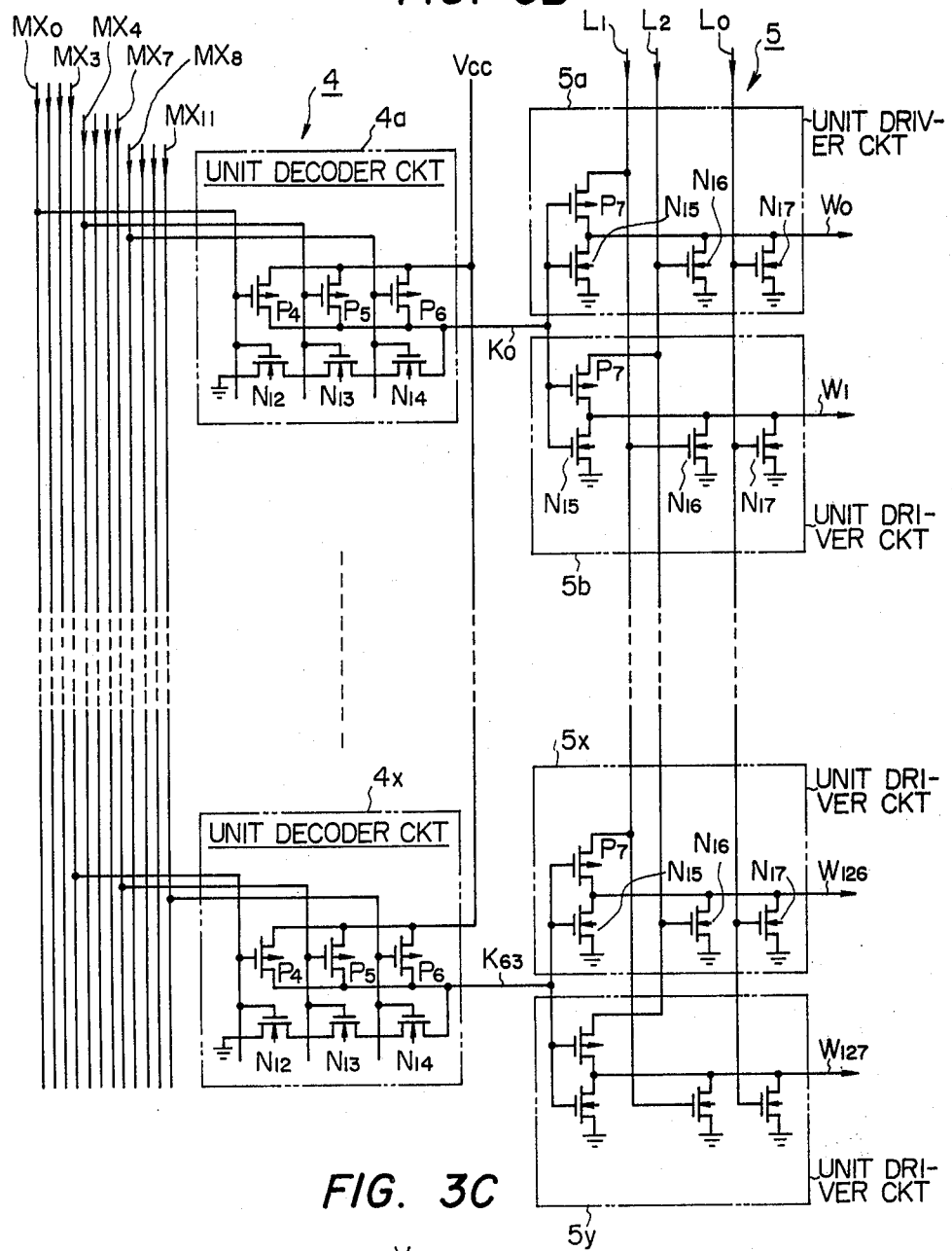
FIG. 3B is a circuit diagram of a second row decoder circuit and a word drive circuit.
Figure 3C:
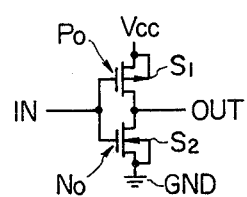
FIG. 3C is a circuit diagram of an inverter circuit.

As shown in FIG. 3C, each of the inverter circuits $IV_1$ and $IV_2$ is constructed of a P-channel type FET $P_0$ and an N-channel type FET $N_0$, the drains of which are connected in common to an output terminal OUT and the gates of which are connected in common to an input terminal IN. Although no illustration is or will be made in FIG. 2 and the succeeding drawings for the sake of brevity, the body gate of a P-channel type FET is connected to the power supply terminal $V_{CC}$ likewise to the body gate $S_1$ of the P-channel type FET $P_0$ in FIG. 3C, and the body gate of an N-channel type FET is connected to the other power supply terminal GND likewise to the body gate $S_2$ of the N-channel type FET $N_0$.

The first row decoder circuit 2 is constructed of unit decoder circuits 2a to 2l each of which receives divided partial address signals of 2 bits to thereby provide the intermediate signal. Every four of the unit decoder circuits constitute substantially one group of circuits in correspondence with the partial address signals. The groups of unit decoder circuits 2ad to 2il have constructions identical to one another. In FIG. 3A, therefore, only the circuit arrangement of the group of unit decoder circuits 2ad is shown in detail.

In the group of unit decoder circuits 2ad, the unit decoder circuit 2a is constructed of a complementary type NAND circuit which is composed of P-channel type FETs $P_1$ and $P_2$ and N-channel type FETs $N_9$ and $N_{10}$, and a complementary type inverter circuit which is composed of a P-channel type FET $P_3$ and an N-channel type FET $N_{11}$ and which receives an output signal of the NAND circuit.

Where at least one of output signals $\overline{B_0}$ and $\overline{B_1}$ of the unit buffer circuits 1a and 1b is at the low level, at least one of the P-channel type FETs $P_1$ and $P_2$ connected in parallel is brought into its "on" state and at least one of the N-channel type FETs $N_9$ and $N_{10}$ connected in series is brought into its "off" state, so that the output signal of the NAND circuit is high.

When both the signals $\overline{B_0}$ and $\overline{B_1}$ are high, the output signal of the NAND circuit is low. The inverter circuit provides a signal inverted with respect to the output signal of the NAND circuit.

In the NAND circuit, the varying rate of its output signal is limited by stray capacitances (not shown) existing between nodes $NA_0$ and $NA_1$ of the circuit and the ground point of the circuit and the "on" resistances of the respective FETs. Whereas the P-channel type FETs $P_1$ and $P_2$ are connected in parallel, the N-channel type FETs $N_9$ and $N_{10}$ are connected in series, so that the fall rate of the output signal is especially limited as compared with the rise rate. In the preferred embodiment, however, only the two N-channel FETs are connected in series as stated above, so that the fall rate of the output signal can be made comparatively high.

Likewise to the unit decoder circuit 2a, each of the unit decoder circuits 2b to 2d is constructed of a NAND circuit and an inverter circuit of the complementary type.

Owing to connections as shown in the figure, the unit decoder circuits 2a to 2d provide the intermediate signals $MX_0$ to $MX_3$ satisfying the following expressions (1) to (4) in response to the signals $B_0$, $\overline{B_0}$, $B_1$ and $\overline{B_1}$ formed on the basis of the partial address signals $A_0$ and $A_1$, respectively:

$$MX_0 = \overline{B_0} \cdot \overline{B_1} \quad (1)$$

$$MX_1 = B_0 \cdot \overline{B_1} \quad (2)$$

$$MX_2 = \overline{B_0} \cdot B_1 \quad (3)$$

$$MX_3 = B_0 \cdot B_1 \quad (4)$$

Similarly, the unit decoder circuits 2e to 2h, and 2i to 2l provide the intermediate signals $MX_4$ to $MX_7$, and $MX_8$ to $MX_{11}$ on the basis of the partial address signals $A_2$ and $A_3$, $A_4$ and $A_5$, respectively.

Each group of unit decoder circuits responds to the four signals from the two unit buffer circuits, to provide the same number of intermediate signals.

Where, as described above, the address signals are divided into the partial address signals each consisting of 2 bits and are decoded for every partial address signal, the number of the unit decoder circuits can be made comparatively small. The types of the intermediate signals to be supplied to the second decoder circuit 4 can be lessened accordingly.

FIG. 3B shows a detailed circuit arrangement of the second decoder circuit 4 and the word drive circuit 5.

The second row decoder circuit 4 is constructed of 64 unit decoders circuits 4a to 4x, while the word drive circuit 5 is constructed of 128 unit drive circuits 5a to 5y. The unit decoder circuits 4a to 4x have constructions identical to one another. That is, each of the unit decoder circuits 4a to 4x is constructed of a complementary NAND circuit which is composed of P-channel type FETs $P_4$ to $P_6$ and N-channel type FETs $N_{12}$ to $N_{14}$.

Each of the unit decoder circuits 4a to 4x has three input terminals. The input terminal connected to the gates of the pair of FETs $P_4$ and $N_{12}$ is supplied with one of the intermediate signals $MX_0$ to $MX_3$, the input terminal connected to the gates of the pair of FETs $P_5$ and $N_{13}$ is supplied with one of the intermediate signals $MX_4$ to $MX_7$, and the input terminal connected to the gates of the remaining pair of FETs $P_6$ and $N_{14}$ is supplied with one of the intermediate signals $MX_8$ to $MX_{11}$.

The unit decoder circuits 4a to 4x are constructed so as to selectively receive the three types of intermediate signals, and are thereby brought into one-to-one correspondence with the respective states of the 6-bit address signals ($A_0$ to $A_5$). For example, the unit decoder circuit 4a is constructed so as to receive the intermediate signals $MX_0$, $MX_4$ and $MX_8$, whereby when all the 6-bit address signals $A_0$ to $A_5$ are low, this unit decocer circuit responds thereto to provide a low level signal $K_0$.

Owing to circuit connections as shown in the figure, the output signal of each of the unit decoder circuits 4a to 4x is supplied to the corresponding two unit drive circuits. Each unit drive circuit also receives control signals $L_0$ to $L_2$ from the word control circuit 3.

The control signal $L_0$ is brought into the low level in response to the situation that the control signal $\overline{CS_2}$ provided from the control circuit has been made low in correspondence with the low level of the chip select signal $\overline{CS}$ and that the signal $B_7$ provided from the address buffer circuit 14 has been made low. The control signal $L_1$ is brought into the high level when the control signal $CS_1$ provided from the control circuit 15 has been made in response to the low level of the chip select signal $\overline{CS}$, and the signals $\overline{B_6}$ and $\overline{B_7}$ provided from the address buffer circuits 1 and 13 have been made high. The control signal $L_2$ is brought into the high level when the control signal $CS_1$ has been made high and the signals $B_6$ and $\overline{B_7}$ have been made high.

In FIG. 3B, the respective unit drive circuits $5a$ to $5y$ are operated by the outputs of the corresponding unit decoder circuits $4a$ to $4x$ when the chip select signals $\overline{CS}$ and the column address signal $B_7$ are low. One of the pair of unit drive circuits $5a$ and $5b$ is operated substantially by the row address signal $\overline{B_6}$ or $B_6$.

By way of example, in a case where the output signal $K_0$ of the unit decoder circuit $4a$ is low in correspondence with the low level of the address signals $A_0$ to $A_5$ as stated above, if the row address signal $\overline{B_6}$ is high, the control signal $L_1$ is high and the control signal $L_2$ is low in reponse to the signal $\overline{B_6}$. The unit drive circuit $5a$ provides a word signal $W_0$ of the high level because a FET $P_7$ is turned "on" and FETs $N_{15}$ to $N_{17}$ are turned "off". The unit drive circuit $5b$ provides a word signal $W_1$ of the low level because the control signal $L_2$ is low and the FET $N_{16}$ is turned "on". On the other hand, if the row address signal $B_6$ is high, the word signal $W_1$ of the unit drive circuit $5b$ is high in response thereto.

As illustrated in FIG. 1, the output signals of the second decoder circuit 4 are supplied to the word drive circuits 5 and 6 in common. Although not shown, the construction of the word drive circuit 6 for the memory array 8 is similar to that of the word drive circuit 5.

The word drive circuit 5 is operated by the output signal of the second decoder circuit 4 when the chip select signal $\overline{CS}$ and the column address signal $B_7$ are low as explained above. On the other hand, the word drive circuit 6 is operated by the output signal of the second decoder circuit 4 when the column address signal $\overline{B_7}$ is low and the chip select signal $\overline{CS}$ is low. The column address signal $\overline{B_7}$ is the phase-inverted signal of the column address signal $B_7$. Accordingly, in correspondence with the level of the column address signal $B_7$, the word drive circuit 5 or the word drive circuit 6 is operated by the output signal of the second decoder circuit 4. Therefore, the word lines of the memory cell arrays 7 and 8 can be selected through the address signals $A_0$ to $A_6$ merely by disposing the single common second decoder circuit 4 for these memory cell arrays 7 and 8.

Owing to this construction, the number of the unit decoder circuits in the second decoder circuit can be reduced by half with respect to the number of word signals required in the memory cell arrays.

In each of the unit decoder circuits constituting the second decoder circuit, the number of the FETs in series connection, which limits the operating speed of the circuit, is reduced as in the unit decoder circuit of the first decoder circuit.

In FIG. 3A, each of the complementary type inverter circuits $IV_1$ and $IV_2$ constituting the unit buffer circuit is allowed to drive only the two pairs of FETs. Therefore, the inverter circuits $IV_1$ and $IV_2$ can be constructed so as to drive comparatively light loads. Similarly, each of the unit decoder circuits constituting the first decoder circuit may drive the comparatively small number of pairs of FETs constituting the second decoder circuit. As a result, the circuits in FIGS. 3A and 3B can be made comparatively small in size and can be operated at high speed.

Figure 4A:
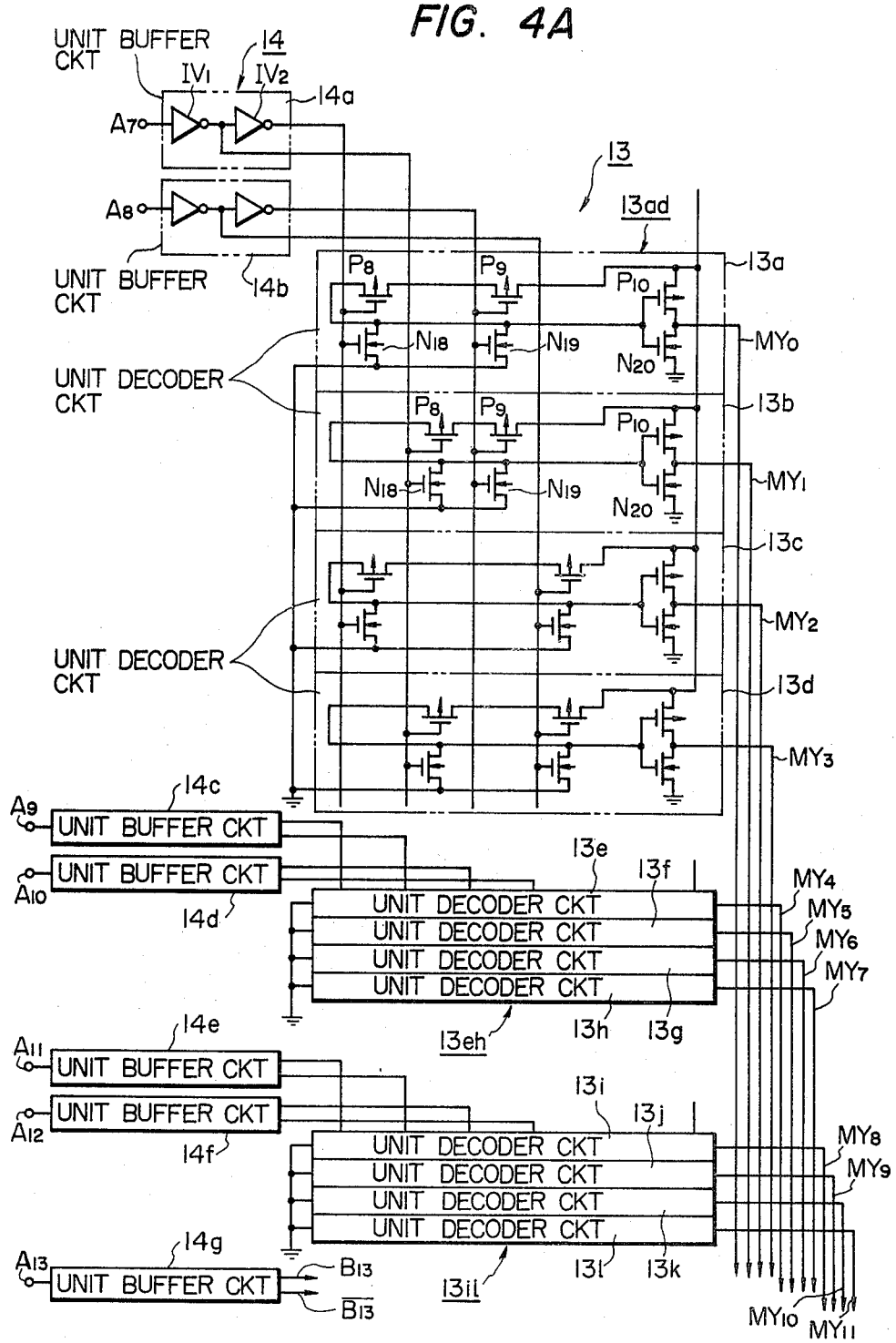
FIG. 4A is a column address buffer circuit and a first column decoder circuit.

FIG. 4A shows concrete circuits of the column address buffer circuit 14 and the first column decoder circuit 13.

The address buffer circuit 14 is constructed of unit buffer circuits $14a$ to $14g$. Likewise to the unit buffer circuits in FIG. 3A, each of the unit buffer circuits is constructed of complementary type inverter circuits $IV_1$ and $IV_2$ connected in series.

As shown in the figure, the first column decoder circuit 13 is constructed of twelve unit decoder circuits $13a$ to $13l$.

The unit decoder circuits $13a$ to $13l$ have constructions similar to one another. More specifically, each of the unit decoder circuits $13a$ to $13l$ is constructed of a complementary type NOR circuit which is composed of P-channel type FETs $P_8$ and $P_9$ and N-channel type FETs $N_{18}$ and $N_{19}$, and a complementary type inverter circuit which is compoed of a P-channel type FET $P_{10}$ and an N-channel type FET $N_{20}$ and which receives an output signal of the NOR circuit.

The unit decoder circuits $13a$ to $13d$ constitute a first group of unit decoder circuits $13ad$, and they provide the intermediate signals $MY_0$ to $MY_3$ respective to partial address signals $A_7$ and $A_8$ of 2 bits respectively.

Owing to the circuit arranged as shown in the figure, the intermediate signals $MY_0$ to $MY_3$ fulfill relations of the following expressions (5) to (8) respectively:

$$MY_0 = \overline{B_7} + \overline{B_8} \qquad (5)$$

$$MY_1 = B_7 + \overline{B_8} \qquad (6)$$

$$MY_2 = \overline{B_7} + B_8 \qquad (7)$$

$$MY_3 = B_7 + B_8 \qquad (8)$$

Similarly, groups of unit decoder circuits $13eh$ and $13il$ provide the intermediate signals $MY_4$ to $MY_7$, and $MY_8$ to $MY_{11}$ in response to the partial address signals respectively.

Figure 4B:
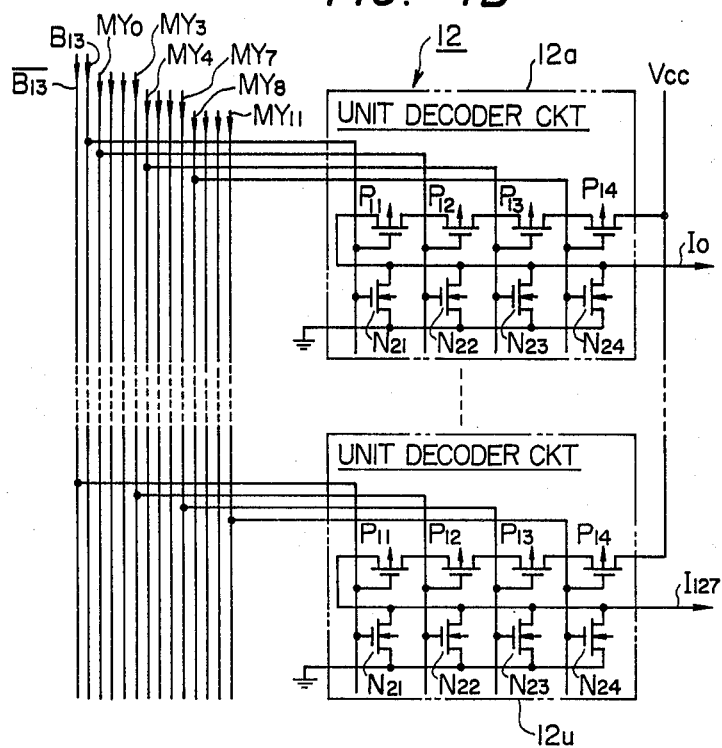
FIGS. 4B and 4C are circuit diagrams each showing a second column decoder circut.

The respective intermediate signals $MY_0$ to $MY_{11}$ and output signals $B_{13}$ and $\overline{B_{13}}$ of the unit buffer circuit $14g$ are supplied to the second column decoder circuit 12 in FIG. 4B.

The second decoder circuit 12 is constructed of 128 unit decoder circuits $12a$ to $12u$. As shown in the figure, each of the unit decoder circuits $12a$ to $12u$ is constructed of a complementary NOR circuit which is composed of P-channel type FETs $P_{11}$ to $P_{14}$ and N-channel type FETs $N_{21}$ to $N_{24}$.

The unit decoder circuits $12a$ to $12u$ are respectively supplied with four types of signals which consist of one signal selected from the signals $B_{13}$ and $\overline{B_{13}}$, one signal selected from the intermediate signals $MY_0$ to $MY_3$, one signal selected from the intermediate signals $MY_4$ to $MY_7$ and one signal selected from the intermediate signals $MY_8$ to $MY_{11}$.

As explained above, the data line of the memory cell array is selected by the signal of the high level from the second decoder circuit 12. Accordingly, the four types of signals to be supplied to the respective unit decoder circuits are selected so that signals from desired unit decoder circuits may become high in a one-to-one correspondence with desired combinations of the levels of the respective input address signals $A_7$ to $A_{12}$.

For example, the unit decoder circuit 12a provides a data line select signal $I_0$ of a high level owing to connections as shown in the figure when all the signals $MY_0$, $MY_4$, $MY_8$ and $B_{13}$ have been made low, that is, when all the address signals $A_7$ to $A_{13}$ have been made low.

By employing the first decoder circuit 13, the number of FETs of the second decoder circuit 12 can be reduced and the operating speed of the second decoder circuit 12 can be enhanced for the same reasons as in the case of FIGS. 3A and 3B.

In contrast, where the first decoder circuit 13 is not employed, one pair of P-channel type FET and an N-channel type FET are required for each input address signal in the unit decoder circuit in the second decoder circuit. Accordingly, the unit decoder circuit requires as many as 7 pairs of (i.e. 14) FETs for the input address signals $A_7$ to $A_{13}$.

In this example, the input address signal $A_{13}$ has no input address signal to be combined therewith. For this reason, the address signals $B_{13}$ and $\overline{B_{13}}$ generated on the basis of the input address signal $A_{13}$ are sent to the second decoder circuit as described above. Thus, the number of input lines necessary for the second decoder circuit 12 may be fourteen. This number is equal to the number of input lines of the decoder circuit in a case where the first decoder circuit 13 is not employed.

Instead of the foregoing measure, the 3 bits of the input address signals $A_{11}$, $A_{12}$ and $A_{13}$ may well be used as partial address signals and be decoded, to thereby be made the intermediate signals which are supplied to the second decoder circuit. In this way, the number of FETs in each of the unit decoder circuits constituting the second decoder circuit can be reduced by 2.

The reduction of the number of the FETs of the second decoder circuit as above stated results in reducing the number of P-channel type FETs which are connected between the power supply terminal $V_{CC}$ and the output in the second decoder circuit. Accordingly, where all the P-channel type FETs $P_{11}$ to $P_{14}$ on turned "on", the "on" resistances of the FETs between the power supply $V_{CC}$ and the output node decrease. As a consequence, the drivability of the second decoder circuit for its load increases, and the change of the signal from the low level to the high level can be quickened.

Moreover, the number of gates of the FETs to be connected to the input lines of the second decoder circuit 12 becomes 64, which is half the number of gates of the FETs to be connected to the lines of the decoder at the time when the first decoder 13 is not utilized. In other words, the load of the first decoder is reduced. Accordingly, the operating speed of the first decoder circuit can be enhanced. In addition, since the load of each buffer circuit is only the first decoder circuit, the operating speed thereof can be enhanced.

Figure 5:
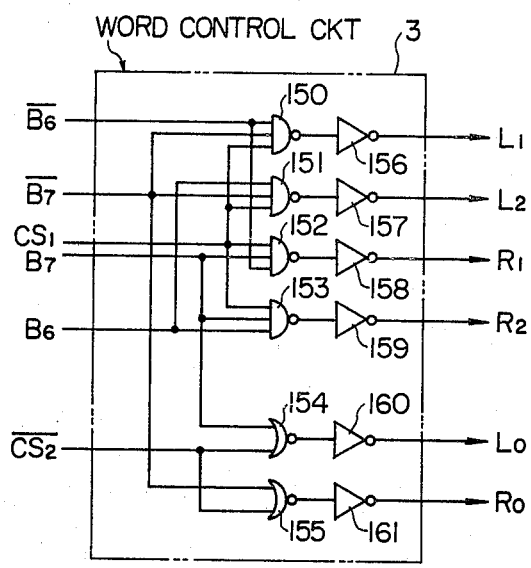
FIG. 5 is a circuit diagram of a word control circuit.

FIG. 5 is a logic diagram of the word control circuit 3.

As shown in the figure, the word control circuit is constructed of NAND gate 150 to 153, NORs 154 and 155, the inverters 156 to 161. Each of the circuits is constructed of complementary FETs.

The control signals $L_0$ and $R_0$ which are provided from the word control circuit 3 are generated in order to select either the first memory cell array 7 or the second memory cell array 8 as described above. Accordingly, while either memory cell array is selected by the control signals, the other memory cell array is non-selected. This eliminates the increase of power dissipation in the non-selected memory cell array.

More specifically, in the mmeory cell arrays 7 and 8, the load FETs $N_1$ and $N_2$ are connected to the respective data lines as shown in FIG. 2. The load FETs are endowed with relatively low impedances as compared with resistances within the memory cells.

Where, in the memory cell array having no memory cell to be selected, the word line has been made the high level, the transfer FETs $N_5$ and $N_6$ of the memory cell are turned "on" by the high level of this word line. As a result, a comparatively large current is caused to flow to the FET $N_7$ or $N_8$ of the memory cell through the load FET $N_1$ or $N_2$ and the transfer FET $N_5$ or $N_6$.

According to this embodiment, all the word lines in the memory cell array which includes no memory cell to be selected are kept intact at the low level by the control signal $L_0$ or $R_0$. Accordingly, the current referred to above is inhibited from flowing to the memory cell in this memory cell array, so that an increase in power dissipation is prevented.

According to this invention, the respective circuits can be formed on a single substrate in an arrangement which makes the size of the substrate smaller.

Figure 6:
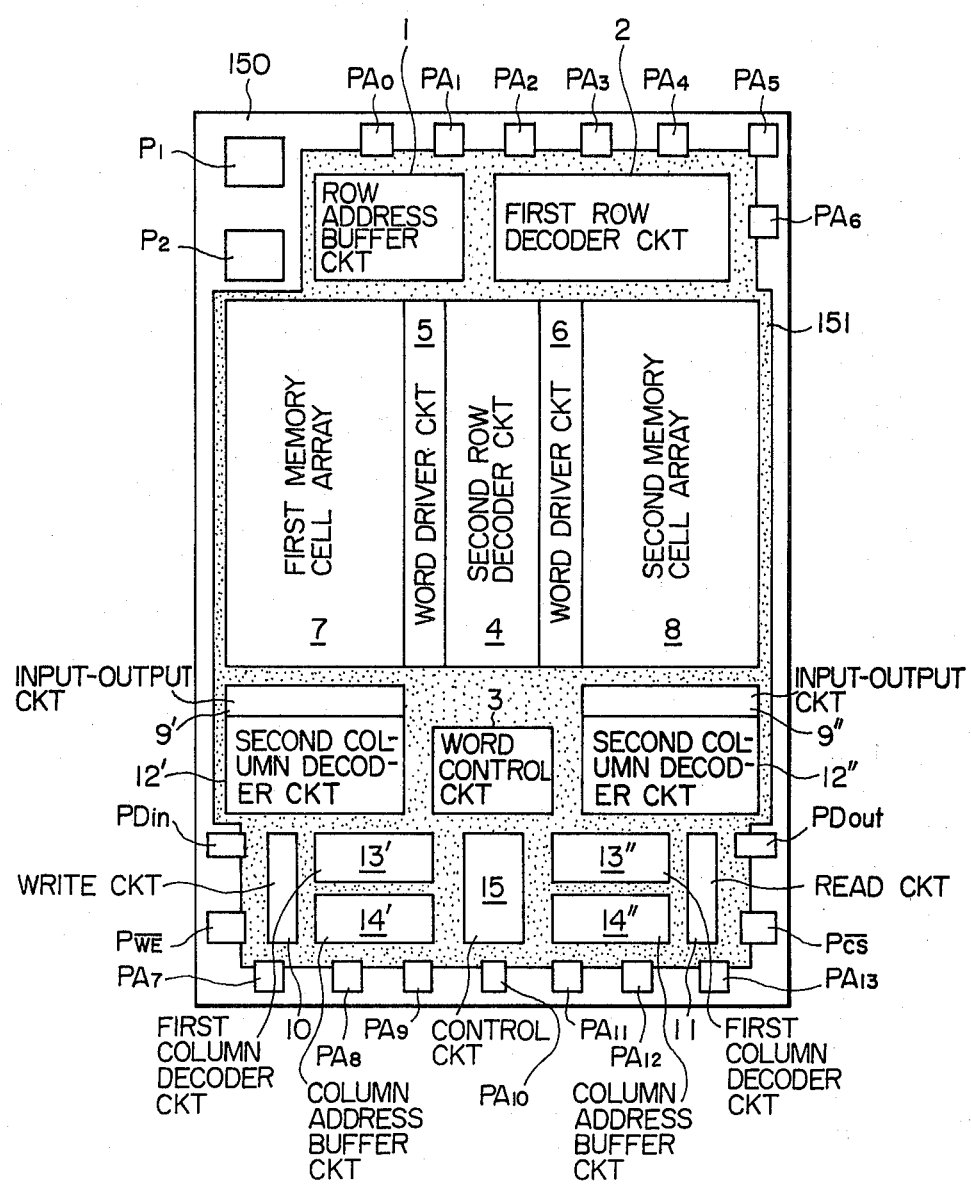
FIG. 6 is a layout diagram on the substrate of a memory to which this invention is applied.

FIG. 6 shows patterns of the respective circuit blocks which are formed on a single semiconductor substrate 150.

Referring to the figure, the second decoder circuit 4 is formed on substantially the central part of the surface of the substrate 150. The word drive circuits 5 and 6 are formed holding the second decoder circuit 4 therebetween, and the first memory cell array 7 and the second memory cell array 8 are formed holding them therebetween.

The second decoder circuit 12 is divided into parts 12' and 12'', which are respectively formed on the lower sides of the first memory cell array 7 and the second memory cell array 8. The input/output circuit 9 is similarly divided into parts 9' and 9'', which are respectively formed between the first memory cell array 7 and the second decoder circuit 12' and between the second memory cell array 8 and the second decoder circuit 12''.

The first decoder circuit 13 and the address buffer circuit 14 are similarly divided into parts 13' and 13'' and parts 14' and 14'', respectively. As shown in the figure, they are formed in those peripheral parts on the surface of the substrate 150 which are spaced from the first and second memory cell arrays 7 and 8 and the second decoder circuit parts 12' and 12''. Also, the address buffer circuit 1 and the first decoder circuit 2 are formed in those peripheral parts on the surface of the substrate 150 which are spaced from the first and second memory cell arrays 7 and 8, the second decoder circuit 4 and the word drive circuits 5 and 6.

Also, the word control circuit 3, the control circuit 15, the write circuit 10 and the read circuit 11 are formed in peripheral parts on the surface of the substrate 150 as shown in the figure.

Bonding pads $PA_0$ to $PA_{13}$ for connecting the terminals to receive the input address signals $A_0$ to $A_{13}$, to terminals outside the circuit device are arranged in marginal parts on the surface of the substrate 150. Similarly, bonding pads $P_1$, $P_2$, $\overline{PWE}$, $\overline{PCS}$, $PD_{in}$, $PD_{out}$, etc. for connecting the terminals to receive the voltages, the control signals $\overline{WE}$ and $\overline{CS}$ and the input signal $D_{in}$, the terminal to provide the signal $D_{out}$, etc., to terminals outside the circuit device are arranged in marginal parts on the surface of the substrate 150.

The interconnections between the various circuits and the various bonding pads are made in an interconnection region 151 which is indicated by dots in the figure.

It is desirable for reducing the occupying area of the memory to make equal to one another the repeated dimension in the columnar direction, or pitch, of the plurality of cells constituting the memory cell array 7 or 8, the pitch of the unit drive circuits in the drive circuit corresponding to the cells, and the pitch of the unit decoder circuits in the second decoder circuit 4 corresponding to the unit drive circuits. If the pitches of the three constituents are different, interconnections for connecting them will bend, and as increased area will be required for the semiconductor substrate on account of the bent parts. It is therefore necessary to make the respective pitches equal as described above.

By constructing each memory cell of a comparatively small number of elements of comparatively small size, the pitch of the plurality of memory cells is made comparatively small.

The unit drive circuits constituting the word drive circuit, and the unit decoder circuits constituting the second decoder circuit include comparatively large numbers of elements of comparatively large size. The elements and interconnections which constitute the unit drive circuits and the unit decoder circuits are usually arranged so as to conform with the pitch of the memory cells.

According to the embodiment, the second decoder circuit can be formed at a comparatively small lateral dimension because the number of the elements thereof is decreased as stated above.

The memory cell arrays, the word drive circuits and the second decoder circuit are integrated with a high density in the memory as stated above. As a result, an area sufficient to arrange another circuit such as a peripheral circuit cannot be provided among them. In contrast, comparatively large vacant areas can be employed among the peripheral circuits and near the bonding pads which are arranged around the aforecited circuits.

According to the invention, the first decoder circuit is arranged in the peripheral parts of the substrate 150 as shown in the figure. As explained above, this first decoder circuit can be divided into several groups of unit decoder circuits each decoding the 2-bit partial address signals. It can accordingly be arranged by effectively utilizing the peripheral vacant area of the substrate 150.

As a consequence, the invention enables a reduction in the size of the semiconductor substrate.

Figure 7A:
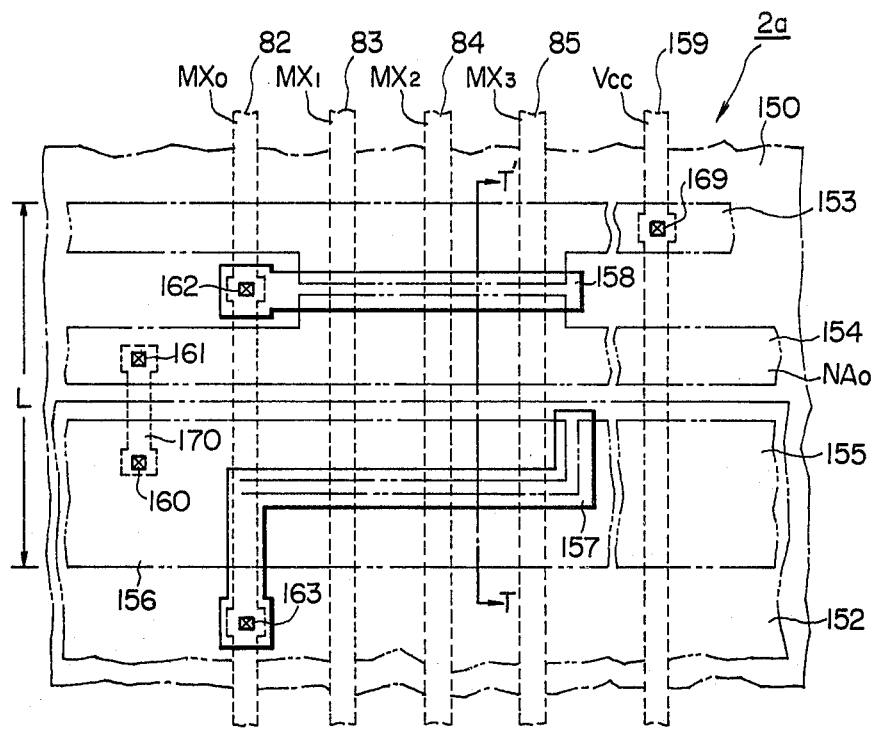
FIG. 7A is a plan view of circuit elements which constitute a decoder circuit.
Figure 7B:
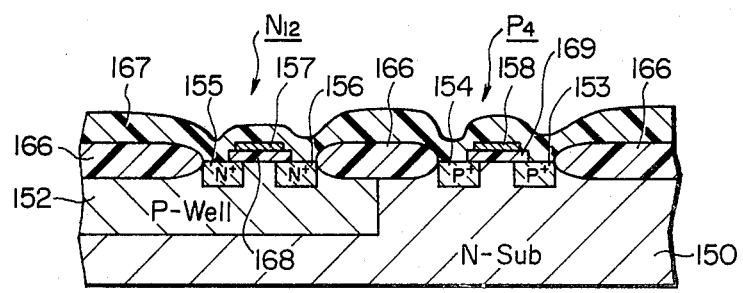
FIG. 7B is a sectional view of a substrate part corresponding to a part T—T' in FIG. 7A.

FIG. 7A is a plan view of circuit elements which constitute the unit decoder circuit 4a of the second decoder circuit 4 in the preferred embodiment of this invention. FIG. 7B is a sectional view of a semiconductor substrate part corresponding to a part T—T' in FIG. 7A. On account of limited space, FIG. 7A shows only the P-channel type FET $P_6$ and the N-channel type FET $N_{14}$ in the unit decoder circuit 4a.

Referring to FIGS. 7A and 7B, numeral 150 designates an N-type substrate, numeral 152 a P-type well region formed in the substrate 150, numerals 153 and 154 P-type semiconductor regions, numerals 155 and 156 N-type semiconductor regions, numerals 82 to 85 and numerals 159 and 170 aluminum interconnection layers, numerals 157 and 158 conductive polycrystalline silicon layers, and numerals 160 to 164 contact portions for electrically connecting the aluminum interconnection layers and the conductive polycrystalline silicon layers or the aluminum interconnection layers and the semiconductor regions.

The P-channel type FET $P_6$ is constructed of the P-type regions 153 and 154 as the source and drain regions thereof and the polycrystalline silicon layer 158 as the gate electrode thereof, while the N-channel type FET $N_{14}$ is constructed of the N-type regions 155 and 156 as the source and drain regions thereof and the polycrystalline silicon layer 157 as the gate electrode thereof. The P-type region 154 is also used as the drain regions of the FETs $P_4$ and $P_5$ although this is not shown in FIGS. 7A and 7B.

The aluminum interconnection layers 82 to 85 are respectively supplied with the intermediate signals $MX_0$ to $MX_3$ from the unit decoder circuits $2a$ to $2d$ in FIG. 3A. The aluminum interconnection layer 82 is connected to the gate electrode 158 of the FET $P_6$ through the contact hole 162, and is further connected to the gate electrode 157 of the FET $N_{14}$ through the contact hole 163.

The aluminum interconnection layer 159 is connected to the P-type region 153 through the contact hole 164. This aluminum interconnection layer 159 functions to supply the voltage $V_{CC}$ to one output electrode of the P-channel type FET $F_6$.

The aluminum interconnection layer 170 is connected to the P-type region 154 through the contact hole 161, and is further connected to the N-type region 156 through the contact hole 160. The output signal $K_0$ is derived through this aluminum interconnection layer 170.

Letter L in FIG. 7A indicates the vertical dimension (pitch) of the unit decoder circuit. It is made equal to the pitch of the plurality of cells in the memory array.

In FIG. 7B, numerals 166 and 167 designate thick insulating films, and numerals 169 and 168 designate the gate oxide films of the P-channel type FET $P_6$ and the N-channel type FET $N_{14}$ respectively.

In the case of rendering the capacity of a memory large by reducing the dimensions of cells, the application of this invention to the memory makes it possible to reduce the dimensions of the second decoder circuit in conformity with the cells as explained above. Thus, the area of a chip can be more effectively used.

According to this invention, the number of FETs to constitute the second decoder circuit can be reduced. Consequently, the area per element of the FETs to constitute the second decoder circuit can be increased in correspondence with the occupying area of the reduced FETs.

By increasing the area of the element in this manner, the "on" resistance of the particular FET can be decreased. It is accordingly possible to further raise the operating speeds of the second decoder circuits explained with reference to FIGS. 3B and 4B.

Figure 8A:
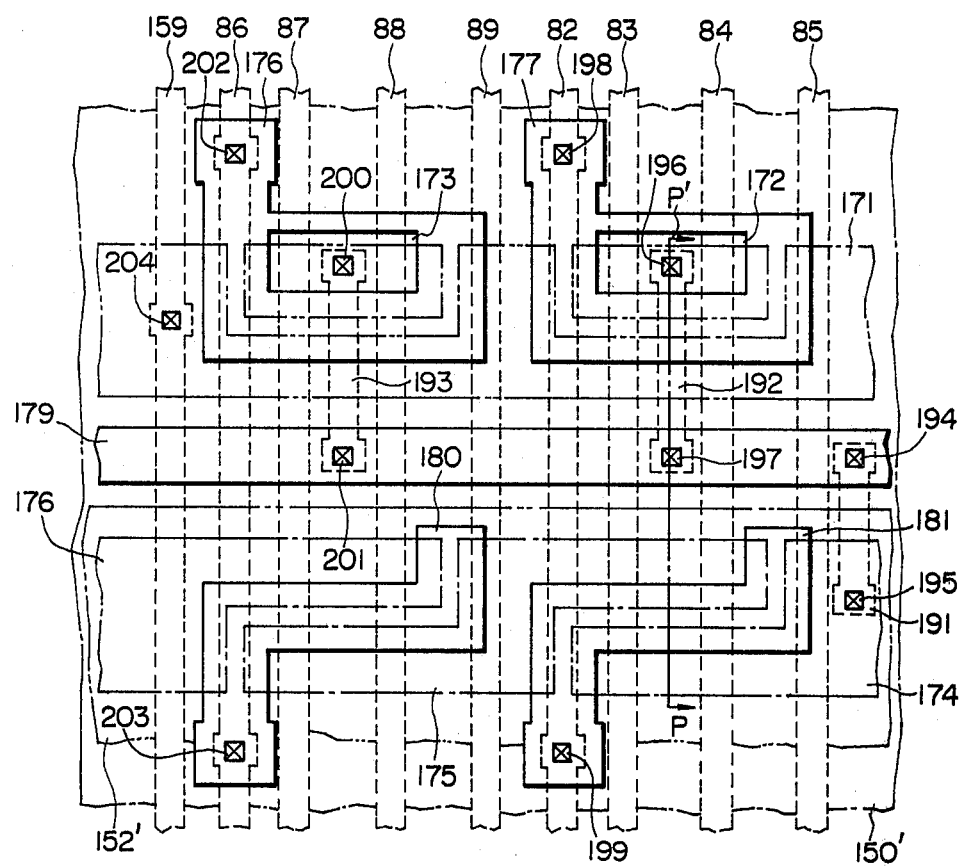
FIG. 8A is a plan view of circuit elements which constitute another decoder circuit.
Figure 8B:
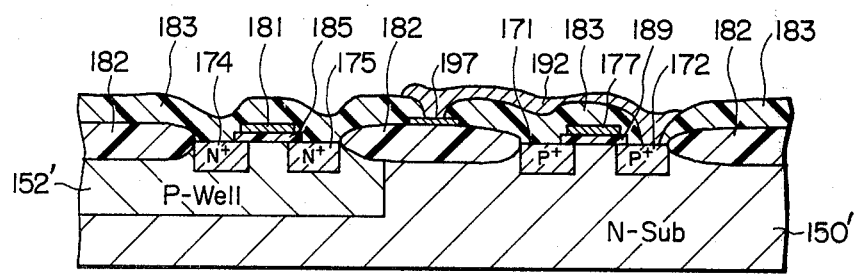
FIG. 8B is a sectional view of a substrate part corresponding to a part P—P' in FIG. 8A.

FIG. 8A is a plan view of an alternative embodiment of a unit decoder circuit to be utilized in place of the unit decoder circuit shown in FIGS. 7A and 7B, while FIG. 8B is a sectional view of a semiconductor substrate part corresponding to a part P—P' in FIG. 8A. On account of limited space, FIG. 8A shows only the P-channel type FETs $P_5$ and $P_6$ and the N-channel type FETs $N_{13}$ and $N_{14}$.

Referring to FIGS. 8A and 8B, numeral 150' indicates an N-type substrate, numeral 152' a P-type well, numerals 171, 172 and 173 P-type semiconductor regions, numerals 174, 175 and 176 N-type semiconductor regions, numerals 82 to 89 and numerals 159, 191, 192 and 193 aluminum interconnection layers, and numerals 176', 177 and 179 conductive polycrystalline silicon layers.

The FET $P_6$ is constructed of the P-type semiconductor regions 171 and 172 and the conductive polycrystalline silicon layer 177, while the FET $P_5$ is constructed of the P-type semiconductor regions 171 and 173 and the conductive polycrystalline silicon layer 176'. The FET $N_{14}$ is constructed of the N-type semiconductor regions 174 and 175 and a conductive polycrystalline silicon layer 181, while the FET $N_{13}$ is constructed of the N-type semiconductor regions 175 and 176 and a conductive polycrystalline silicon layer 180. The aluminum interconnection layer 86 is connected to the gate electrode 176' of the FET $P_5$ through a contact hole 202, and is further connected to the gate electrode 180 of the FET $N_{13}$ through a contact hole 203. The aluminum interconnection layer 82 is connected to the gate electrode 177 of the FET $P_6$ through a contact hole 198, and is further connected to the gate electrode 181 of the FET $N_{14}$ through a contact hole 199.

Numeral 159 in FIG. 8A indicates an aluminum interconnection layer, which is connected to the P-type semiconductor region 171 through a contact hole 204. This aluminum interconnection layer functions to supply the voltage $V_{CC}$ to the P-type semiconductor region 171 which forms one output electrode of each of the FETs $P_6$ and $P_5$.

The aluminum interconnection layer 193 serves to electrically connect the P-type semiconductor region 173 forming the other output electrode of the FET $P_5$, to the conductive polycrystalline silicon layer 179. It is connected to the P-type region 173 and the polycrystalline silicon layer 179 through contact holes 200 and 201 respectively.

The aluminum interconnection layer 192 serves to electrically connect the P-type region 172 forming the other output electrode of the FET $P_6$, to the polycrystalline silicon layer 179. It is connected to the P-type region 172 and the polycrystalline silicon layer 179 through contact holes 196 and 197 respectively.

The aluminum interconnection layer 191 serves to electrically connect the N-type region 174 and the polycrystalline silicon layer 179. It is connected to the polycrystalline silicon layer 179 and the N-type region 174 through contact holes 194 and 195 respectively.

The output signal $K_0$ of the unit decoder circuit is derived from the polycrystalline silicon layer 179.

Numerals 182 and 183 in FIG. 8B denote thick oxide films. Numeral 189 denotes the gate oxide film of the FET $P_6$, and numeral 185 the gate oxide film of the FET $N_{14}$.

This invention is not restricted to the foregoing embodiments.

Figure 4C:
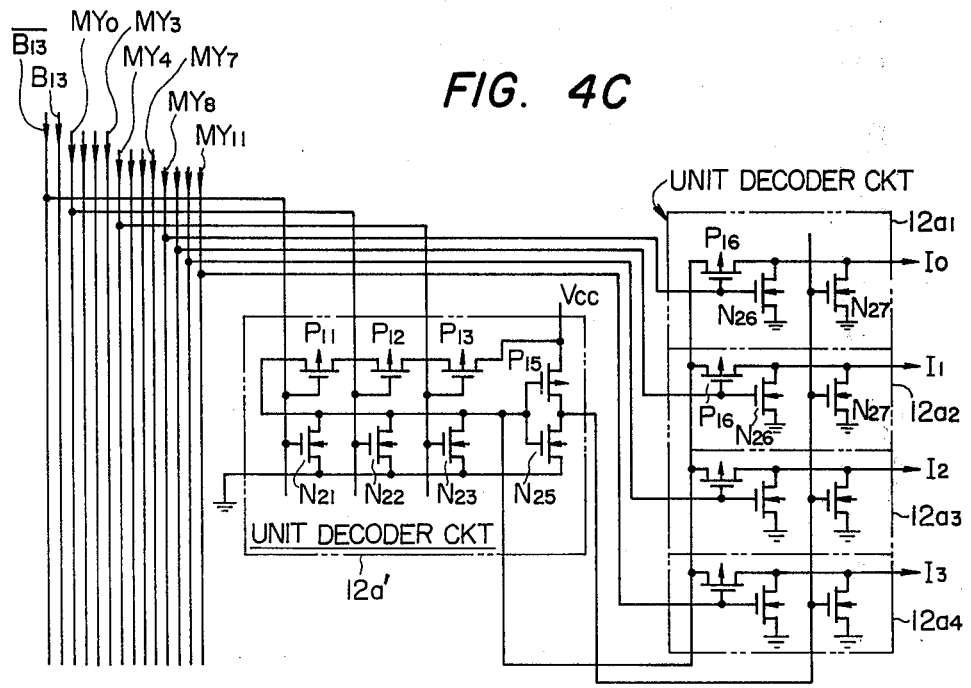

By way of example, the unit decoder circuit 12 in FIG. 4B can be replaced with the combination as shown in FIG. 4C between a unit decoder circuit 12a' and a unit decoder circuit which receives an output signal of the unit decoder circuit 12a' and the intermediate signals $MY_8$ to $MY_{11}$. In FIG. 4C, circuits as exemplified by that 12a can be reduced to one-fourth with respect to the case of FIG. 4B.

Further various circuits stated above may be constructed using FETs of the single channel type.

Figure 9A:
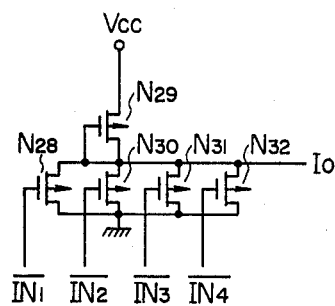
FIGS. 9A, 9B and 9C are circuit diagrams each showing another form of the second decoder circuit to which this invention is applied.

FIG. 9A is a circuit diagram of a unit decoder circuit which is constructed of N-channel type FETs $N_{28}$ to $N_{32}$. Thus, the number of elements which constitute the unit decoder circuit can be made still smaller than in the circuit employing complementary FETs.

Figure 9B:
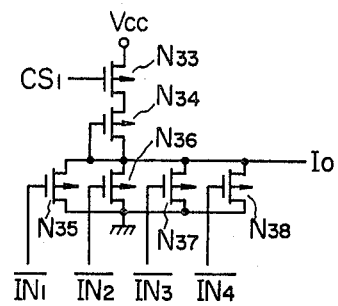

FIG. 9B is a circuit diagram of a unit decoder circuit which is constructed of N-channel type FETs $N_{33}$ to $N_{38}$. In this case, the FET $N_{33}$ is turned "on" or "off" by the control signal $CS_1$ from the control circuit 15. It is therefore possible to prevent the unit decoder circuit from dissipating power during the non-selection of the memory.

Figure 9C:
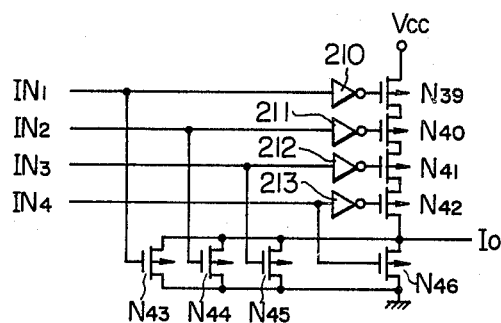

FIG. 9C is a circuit diagram of a unit decoder circuit which is constructed of N-channel type FETs $N_{39}$ to $N_{46}$ and inverter circuits 210 to 213. In this case, the power dissipation in the second decoder circuit can be decreased by disposing the inverter circuits.

In each of the foregoing embodiments, the four address signals corresponding to the two input address signals are decoded in the unit decoder circuit of the first decoder circuit, and the intermediate signals obtained by the decoding are decoded again in the unit decoder circuit of the second decoder circuit.

It is also possible, however, to have three or more input address signals set, six or more address signals corresponding thereto decoded in the unit decoder circuit of the first decoder circuit, and the intermediate signals thus obtained further decoded in the unit decoder circuit of the second decoder circuit. In this way, the number of FETs to constitute the second decoder circuit can be further reduced.

By way of example, when the above construction is applied to the input address signals $A_0$, $A_1$ and $A_2$ in the foregoing embodiment, the number of FETs to constitute the unit decoder circuit of the second decoder circuit can be four.

Figure 10A:
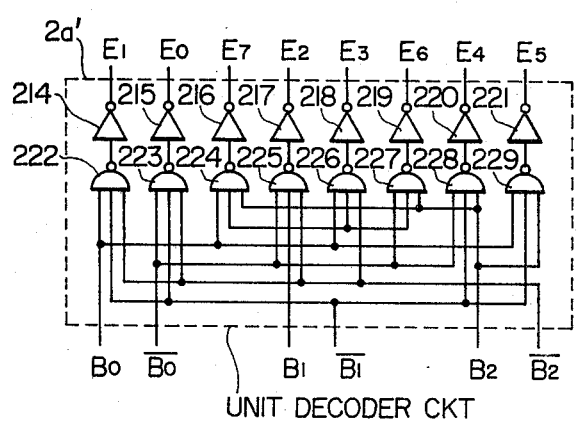
FIG. 10A is a circuit diagram of another form of the first decoder circuit.

In this case, the unit decoder circuit of the first decoder circuit becomes a logic circuit as shown in FIG. 10A.

This unit decoder circuit 2a' is constructed of NAND circuits 222 to 229 and inverter circuits 214 to 221. It receives address signals $B_0$ to $B_2$ and $\overline{B_0}$ to $\overline{B_2}$ generated on the basis of the input address signals from the address buffer circuit 1, and provides decoded intermediate signals $E_0$ to $E_7$.

Figure 10B:
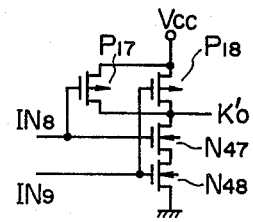
FIG. 10B is a circuit diagram of another form of the second decoder circuit.

When such a unit decoder circuit 2a' is used, the unit decoder circuit of the second decoder circuit becomes a circuit as shown in FIG. 10B. This unit decoder circuit is constructed of P-channel type FETs $P_{17}$ and $P_{18}$ and N-channel type FETs $N_{47}$ and $N_{48}$. The unit decoder circuit has only two inputs. As the input $IN_8$, for example, any one of the intermediate signals $E_0$ to $E_7$ may be applied. That is, the single unit decoder circuit of the second decoder circuit requires only two FETs with respect to the input address signals $A_0$, $A_1$ and $A_2$. Accordingly, the number of elements of the second decoder circuit can be further reduced.

In the foregoing embodiments, this invention is applied to a memory employing the cells of the static type. However, this invention is not restricted thereto, but it is also applicable to a memory employing cells of the dynamic type. Effects in this case are the same as those in the various embodiments described above.

It is to be understood that the above-described arrangements are simply illustrate of the application of the principles of this invention. Numerous other arrangements may be readily devised by those skilled in the art which embody the principles of the invention and fall within its spirit and scope.

I claim:

1. A semiconductor memory circuit device comprising:
   a memory cell array comprising a plurality of memory cells arranged in rows and columns;
   first means for receiving input row address signals, each of which comprises a predetermined number of bits, said first receiving means providing an output of row address signals;
   a row decoder circuit which receives said row address signals from said first receiving means and provides output decoded signals for selecting a row from said memory cell array, said row decoder circuit being comprised of a plurality of NAND circuits;
   a word driver circuit connected between the output of said row decoder circuit and said memory array;
   second means for receiving input column address signals, each of which comprises a predetermined number of bits, said second receiving means providing an output of column address signals; and
   a column decoder circuit which receives said column address signals from said second receiving means and provides output decoded signals for selecting a column of said memory array, said column decoder circuit being comprised of a plurality of NOR circuits.

2. A semiconductor memory circuit device comprising:
   a memory cell array comprising a plurality of memory cells arranged in rows and columns;
   first means for receiving input row address signals, each of which comprises a predetermined number of bits, said first receiving means providing an output of at least first partial row address signals, each of which comprises a portion of said predetermined number of bits of a corresponding input row address signal;
   a first row decoder circuit comprised of a plurality of first unit row decoders, each of which receives said first partial row address signals from said first receiving means and provides intermediate first decoded signals of said first partial address signals, each of said first unit row decoders being comprised of a NAND circuit;
   a plurality of first inverters;
   a second row decoder circuit comprised of a plurality of second unit row decoders, each of which selectively receives said first intermediate decoded signals through said first inverters and provides an output decoded signal for selecting a row from said memory cell array, each of said second unit row decoders being comprised of a NAND circuit;
   a word driver circuit connected between the output of said second row decoder circuit and said memory cell array;
   second means for receiving input column address signals, each of which comprises a predetermined number of bits, said second receiving means providing an output of at least first partial column address signals, each of which comprises a portion of said predetermined number of bits of a corresponding input column address signal;
   a first column decoder circuit comprised of a plurality of first unit column decoders, each of which receives said first partial column address signals from said second receiving means and provides second intermediate decoded signals of said first partial column address signals, each of said first unit column decoders being comprised of a NOR circuit;
   a plurality of second inverters; and
   a second column decoder circuit comprised of a plurality of second unit column decoders, each of which selectively receives said second intermediate decoded signals through said second inverters and provides output decoded signals for selecting a column of said memory array, each of said second unit column decoders being comprised of a NOR circuit.

3. A semiconductor memory circuit device according to claim 2, wherein each of said unit first row decoders and unit first column decoders is responsive to two bits of said first partial row address signals and first parallel column address signals, respectively.

4. A semiconductor memory circuit device according to claim 3, wherein for 2-bit input signals made up of bits $B_{X0}$, $B_{X1}$, $\overline{B_{X0}}$ and $\overline{B_{X1}}$, each of said unit first row decoders provides intermediate decoded output signals of $$MX_0 = \overline{B_{X0}} \cdot \overline{B_{X1}}$$

$$MX_1 = B_{X0} \cdot \overline{B_{X1}}$$

$$MX_2 = \overline{B_{X0}} \cdot B_{X1}$$

$$MX_3 = B_{X0} \cdot B_{X1}$$

and wherein for input signals made up of bits $B_{Y0}$, $B_{Y1}$, $\overline{B_{Y0}}$ and $\overline{B_{Y1}}$, each of said first column unit decoders provides intermediate decoded output signals of:

$$MY_0 = \overline{B_{Y0}} \cdot \overline{B_{Y1}}$$

$$MY_1 = B_{Y0} \cdot B_{Y1}$$

$$MY_2 = B_{Y0} \cdot \overline{B_{Y1}}$$

$$MY_3 = \overline{B_{Y0}} \cdot B_{Y1}.$$

5. A semiconductor memory circuit device according to claim 2, wherein said first receiving means provides an additional output of second partial row address signals, each of which comprises a different portion of said predetermined number of bits of said corresponding input row address signals than said first partial row address signals, and further comprising a word control circuit coupled between said first receiving means and said word driver circuit, wherein said word control circuit receives said second partial row address signals and controls said word driver circuit in accordance with said second partial row address signals to provide word signals for selecting rows from said memory array.

6. A semiconductor memory circuit device according to claim 5, wherein said word driver comprises a plurality of unit driver circuits, and wherein the pitch in a column direction between individual memory cells in said memory array is equal to the pitch in a columnar direction between the unit decoder circuits in said second row decoder and the pitch in a columnar direction between unit driver circuits in said word driver circuit.

7. A semiconductor memory circuit device according to claim 2, wherein each of first and second unit row decoders is comprised of a complementary NAND circuit, and each of said first and second unit column decoders is comprised of a complementary NOR circuit.

8. A semiconductor memory circuit device according to claim 7, wherein said word driver circuit comprises a plurality of complementary type unit driver circuits, each of said unit driver circuits including a first FET of first conductivity type having a source connected to an output of said word control circuit, a drain connected to said memory cell array and gate connected to the output of said second row decoder circuit, and a second FET of second conducivity type having a source connected to a reference potential point, a drain connected to the drain of said first FET, and a gate commonly connected to the gate of said first FET.

9. A semiconductor memory circuit device according to claim 8, wherein each of the outputs of said second unit row decoders is connected to at least two unit driver circuits.

* * * * *